United States Patent
Preston et al.

(10) Patent No.: US 11,668,845 B2
(45) Date of Patent: Jun. 6, 2023

(54) WIDE BAND GAP SEMICONDUCTOR NAND BASED NEUTRON DETECTION SYSTEMS AND METHODS

(71) Applicant: Consolidated Nuclear Security, LLC, Oak Ridge, TN (US)

(72) Inventors: Jeffrey Robert Preston, Knoxville, TN (US); Ashley C. Stowe, Knoxville, TN (US)

(73) Assignee: Consolidated Nuclear Security, LLC, Oak Ridge, TN (US)

( * ) Notice: Subject to any disclaimer, the term of this patent is extended or adjusted under 35 U.S.C. 154(b) by 6 days.

(21) Appl. No.: 17/370,366

(22) Filed: Jul. 8, 2021

(65) Prior Publication Data

US 2023/0019822 A1    Jan. 19, 2023

(51) Int. Cl.
  G01T 1/24     (2006.01)
  H01L 31/032   (2006.01)
  G01T 3/08     (2006.01)

(52) U.S. Cl.
  CPC .............. G01T 1/245 (2013.01); G01T 3/08 (2013.01); H01L 31/0322 (2013.01)

(58) Field of Classification Search
  CPC ........ G01T 1/245; G01T 3/08; H01L 31/0322
  See application file for complete search history.

(56) References Cited

U.S. PATENT DOCUMENTS

| | | | |
|---|---|---|---|
| 3,387,286 A | 6/1968 | Dennard | |
| 5,726,453 A | 3/1998 | Lott et al. | |
| 6,075,261 A | 6/2000 | Hossain et al. | |
| 6,867,444 B1 * | 3/2005 | Hughes | G01T 3/08 257/E31.086 |
| 7,629,588 B1 | 12/2009 | Bell et al. | |
| 7,687,780 B2 | 3/2010 | Bell et al. | |
| 7,952,075 B2 | 5/2011 | Bell et al. | |
| 9,334,581 B2 | 5/2016 | Stowe et al. | |
| 9,429,662 B2 | 8/2016 | Stowe et al. | |
| 9,638,813 B2 | 5/2017 | Stowe et al. | |
| 9,658,350 B2 | 5/2017 | Stowe et al. | |
| 9,881,708 B1 | 1/2018 | Vencelj et al. | |
| 9,978,469 B1 | 5/2018 | Vencelj et al. | |
| 10,114,131 B1 | 10/2018 | Preston et al. | |
| 2012/0280133 A1 | 11/2012 | Kagey et al. | |
| 2013/0240744 A1 | 9/2013 | Hurst, Jr. et al. | |
| 2017/0082689 A1 * | 3/2017 | Gaspard | G06F 11/1004 |
| 2017/0090045 A9 * | 3/2017 | Stowe | G01T 3/06 |

OTHER PUBLICATIONS

Marta Bagatin et al. "A Heavy-Ion Detector Based on 3-D NAND Flash Memories", IEEE Transactions on Nuclear Science, vol. 67, No. 1, Jan. 2020, pp. 154-160 (Year: 2020).*

(Continued)

*Primary Examiner* — Hugh Maupin
(74) *Attorney, Agent, or Firm* — Clements Bernard Walker; Christopher L. Bernard; Christine Wilkes Beninati

(57) ABSTRACT

A wide band gap semiconductor NAND based neutron detection system includes a semiconductor layer comprising a wide band gap material with a neutron absorber material in the wide band gap material, and the semiconductor layer is the only layer of the wide band gap semiconductor NAND based neutron detection system fabricated with the neutron absorber material.

14 Claims, 3 Drawing Sheets

(56) References Cited

OTHER PUBLICATIONS

McNeil, W.J., et al., "Preliminary Tests of a High Efficiency 1-D Silicon Pixel Array for Small Angle Neutron Scattering." IEEE Nuclear Science Symposium Conference Record. N51-4, 2007, pp. 2340-2342.

Radiation Detection Technologies, Inc. "Microstructured Semiconductor Neutron Detector (MSND)", MSND Tile, Dec. 31, 2020, pp. 1-6.

Intel FPGAS and Programmable Devices, "Single Event Upsets", https://www.intel.com/content/www/us/en/?programmable/support/quality-and-reliability/seu.html, 2 pages.

Lukosi, E. et al., "Response Functions of Semiconducting Lithium Indium Diselenide", Nuclear Instruments and Methods in Physics Research A 822 (2016), University of Tennessee, Knoxville, TN, USA, pp. 9-14.

Toshiba Semiconductor Company, "What is NAND Flash Memory", NAND vs. NOR Flash Memory—Cell Structure, Mar. 2003. 15 pages.

Sense Light, SensL, "Introduction to SiPM", (2011) pp. 1-16.

Toshiba, Toshiba America Electronic Components, Inc., "NAND vs. NOR Flash Memory", pp. 1-4.

\* cited by examiner

WIDE BAND GAP SEMICONDUCTOR NAND BASED NEUTRON DETECTION SYSTEMS AND METHODS

STATEMENT REGARDING FEDERALLY SPONSORED RESEARCH OR DEVELOPMENT

The U.S. Government has rights to the present disclosure pursuant to Contract No. DE-NA0001942 between the U.S. Department of Energy and Consolidated Nuclear Security, LLC.

FIELD OF THE DISCLOSURE

The present disclosure relates generally to solid state wide band gap neutron detection systems and methods. More specifically, the present disclosure relates to solid state wide band gap, especially chalcopyrite, semiconductor NAND based neutron detection systems and methods.

BACKGROUND OF THE DISCLOSURE

Semiconductor radiation detection can employ silicon diodes, high purity germanium (cooled by liquid nitrogen), and compound semiconductors, such as cadmium zinc telluride (CZT) and mercuric iodide. Each of these materials has one or more drawbacks related to its use. Silicon has a low atomic number and is therefore primarily useful for the detection of energetic charged particles and atomic x-rays emitted by low atomic number elements. Germanium has a higher atomic number but, because of its low band gap energy, must be cooled by liquid nitrogen in a bulky, expensive, and potentially dangerous cryogenic systems in order to reduce thermally generated noise. Compound semiconductors, such as CZT and mercuric iodide, have sufficiently high band gap energy to be useful at or near room temperature. However, CZT has been plagued by production problems, resulting in polycrystalline ingots with twins, inclusions, and grain boundary defects. These defects can never be completely removed and are a consequence of CZT being a solid solution, rather than a true compound. The result is that spectroscopy grade crystals must be mined from bulk material. Mercuric iodide suffers from low carrier mobility, short carrier lifetime, space charge polarization, and surface degradation. In addition, mercuric iodide is an extremely soft material that is easily damaged by the slight pressure of an electrical connection and by temperatures over sixty degrees Celsius. In general, these compound semiconductors do not interact with neutrons such that they must be coupled with a separate layer of a neutron absorbing material, such as $^6$LiF or $^{10}$B. A reaction between $^6$Li or $^{10}$B occurs in the separate layer, which creates alpha particles that are detected by a semiconducting substrate. $^3$He gas filled tube detectors also have been employed for thermal neutron detection.

U.S. Patent Application Publication No. 2013/0240744 A1, assigned on its face to Trusted Semiconductor Solutions Inc. ("TSS Inc."), discloses a neutron detection assembly formed of a sensing element structure and a neutron conversion structure, which are separately fabricated and then joined together to form the assembly. The sensing element structure includes a substrate, such as a SOI substrate, and an active semiconductor layer and an interconnect layer.

The neutron conversion structure includes a base layer or substrate and a neutron conversion layer, and is attached to the substrate of the sensing element structure, with the neutron conversion layer being positioned in close proximity to the MOS transistors in the active semiconductor layer. The neutron conversion layer can include material such a boron, lithium or a combination thereof. One or more windows may be etched or otherwise formed in the substrate, which contain a medium such as a vacuum, air or other low-density gas with a low stopping power for charged particles. Thus, an add-on portion or additional packing is needed to be employed in the TSS Inc. multi-piece systems.

Moreover, semiconductor radiation detectors typically involve high voltage and intricate readout mechanisms included for signal preamplification, analog to digital converters, and digital signal processing. High voltage is often necessary to create thick detectors in an attempt to overcome low electron-hole mobilities.

Thus, new and improved semiconductor radiation detectors and systems are needed, especially ones that can bypass the high voltage and readout electronics. Embodiments of the invention address the foregoing needs and others.

BRIEF SUMMARY OF THE DISCLOSURE

Embodiments of the invention bypass the high voltage and readout electronics by creating a memory structure within a wide band gap material, such as a chalcopyrite material, that may be cyclically read as a direct digital output by a low power microcontroller or other controlled circuit. Sufficient voltage may be applied to the gate to charge the electrodes, where upon a neutron event, the charged particle transport occurring within the gate causes discharge of the electrodes effectively switching the logical value of the gate from a 1 to 0. In silicon memory when doped with boron, this may be referred to as the Single Event Upset (SEU) that causes memory errors in instructions intended for high altitude or space applications where rates are rather low as dopants are on the order of parts per billion (PPB). When the memory is read by the controller circuit, a summation of the 0's divided by the time since the previous read creates the "counts per seconds." Gates can be reset to a logical 1 at the direction of the controller. This may create the "Set-Reset" or SR latch as a NAND circuit.

Thus, according to embodiments, the present disclosure provides a wide band gap semiconductor NAND based neutron detection system. The system comprises a semiconductor layer comprising a wide band gap material with a neutron absorber material in the wide band gap material, wherein the semiconductor layer is the only layer of the semiconductor NAND based neutron detection system fabricated with the neutron absorber material.

In some embodiments, the neutron absorber material comprises at least one of lithium and boron.

In some embodiments, the neutron absorber material comprises $^6$LiF and $^{10}$B.

In some embodiments, the wide band gap material comprises a chalcopyrite compound comprising single crystals.

In some embodiments, the semiconductor layer comprises a wafer.

In some embodiments, the wafer comprises a $^6$LiInSe$_2$ single crystal wafer.

In some embodiments, the wide band gap semiconductor NAND based neutron detection comprises a latch including a NAND SR (Set-Reset) latch circuit, wherein a memory structure is located with the chalcopyrite compound.

In some embodiments, the memory structure is configured to be read as a direct digital output by a controller.

In some embodiments, the system is at least one of a portable instrument, a handheld instrument and a wearable instrument.

In some embodiments, the wide band gap semiconductor NAND based neutron detection system further comprises an interconnection layer adjacent to the semiconductor layer including interconnection elements.

According to further embodiments, the present disclosure provides a method of making a wide band gap semiconductor NAND based neutron detection system. The method comprises providing a semiconductor layer comprising a wide band gap material with a neutron absorber material in the wide band gap material, wherein the semiconductor layer is the only layer of the wide band gap semiconductor NAND based neutron detection system fabricated with the neutron absorber material.

In some further embodiments, the neutron absorber material comprises at least one of lithium and boron.

In some further embodiments, the neutron absorber material comprises $^6$LiF and $^{10}$B.

In some further embodiments, the wide band gap material comprises a chalcopyrite compound comprising single crystals.

In some further embodiments, the method comprises fabricating the semiconductor layer as a wafer.

In some further embodiments, the wafer comprises a $^6$LiInSe$_2$ single crystal wafer.

In some further embodiments, the wide band gap semiconductor NAND based neutron detection system comprises a latch including a NAND SR (Set-Reset) latch circuit, wherein a memory structure is located with the chalcopyrite compound.

In some further embodiments, the memory structure is configured to be read as a direct digital output by a controller.

In some further embodiments, the wide band gap semiconductor NAND based neutron detection system is at least one of a portable instrument, a handheld instrument and a wearable instrument.

In some further embodiments, the method comprises providing an interconnection layer adjacent to the semiconductor layer, wherein the interconnection layer includes interconnection elements.

BRIEF DESCRIPTION OF THE DRAWINGS

The present disclosure is illustrated and described herein with reference to the various drawings, in which like reference numbers are used to denote like method steps/device components, as appropriate, and in which.

DETAILED DESCRIPTION OF THE DISCLOSURE

Figure 1:
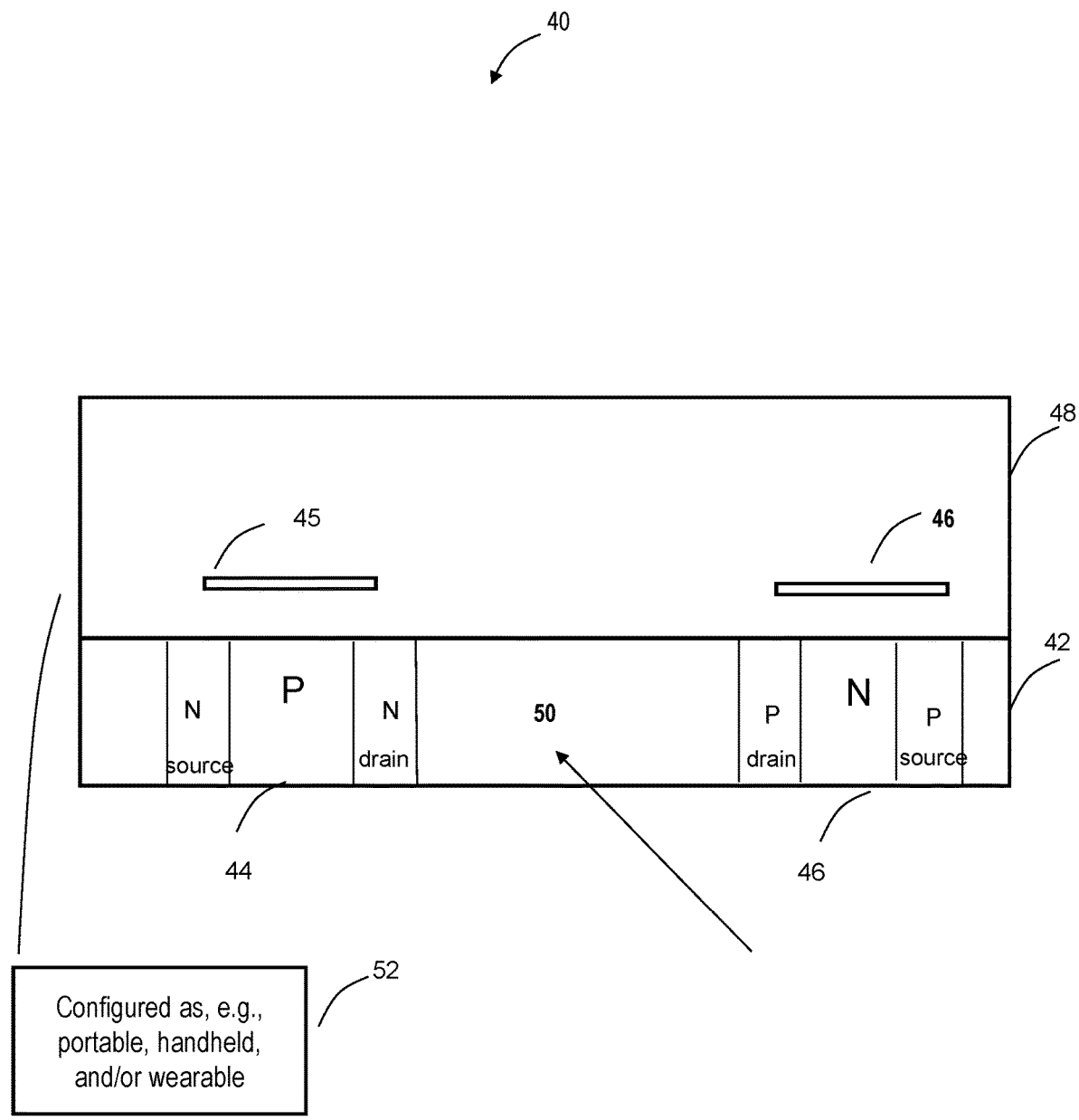
FIG. 1 is a schematic diagram illustrating an exemplary embodiment of a neutron detection system of the present disclosure.

According to embodiments, and as shown in FIG. 1, a wide band gap semiconductor NAND based neutron detection system 40 comprises a semiconductor layer 42 comprising a wide band gap material, such as chalcopyrite compound, with a neutron absorber material in the wide band gap material, as further described below, wherein the semiconductor layer 42 is the only layer of the semiconductor NAND based neutron detection system 40 fabricated with the neutron absorber material. The neutron absorbing material may include at least one of lithium and boron. For example, $^6$LiF and $^{10}$B are especially suitable neutron absorbing materials.

The wide band gap material of the semiconductor layer 42 may be any suitable wide band material with a neutron absorber therein. A wide band gap material may herein refer to a material having a band gap wider than silicon. Non-limiting examples include silicon carbide, silicon dioxide, aluminum nitride, gallium nitride, boron nitride and diamond, among others. The wide band gap material may comprise elements with intrinsic neutron sensitivity and/or containing neutron sensitive dopants. Suitable materials may also include specialty semiconductors that may operate at highly elevated temperatures (e.g., SiC) that could easily be doped with a neutron sensitive isotope. While doping may not be most optimal from a detection efficiency standpoint, some semiconductors may lend themselves to this method rather than as a primary constituent. This may include CdTe, CdZnTe, CdSe, (more broadly the ii-vi family of semiconductors) and GaN (iii-v family). For the elements with intrinsic neutron sensitivity, these may primarily include Boron-10 and Lithium-6. Other elements may contain neutron sensitivity, but it is the particular (n, alpha) reaction that may provide a more optimal energy range to induce an SEU. Others that may be useful with one or more isotopes include gadolinium and cadmium. The wide band gap material of the semiconductor layer 42 may also advantageously comprise a chalcopyrite compound. The chalcopyrite compound of the semiconductor layer 42 may be any suitable chalcopyrite material or crystal with a neutron absorber material therein. Suitable compounds may include those having a composition I-III-VI2 or II-IV-V2, where the "I" component is from column 1A or 1B of the periodic table, the "II" component is from column 2B of the periodic table, the "III" component is from column 3A of the periodic table, the "IV" component is from column 4A of the periodic table, the "V" component is from column 5 A of the periodic table, and the "VI" component is from column 6A of the periodic table. The compound may be formed from elements in the group of 1A-3A-6A, 1B-3A-6A, or 2B-4A-5A of the periodic table. An example from group 1A-3A-6A is lithium-gallium-selenium. An example from group 1B-3A-6A is copper-gallium-selenium. An example from group 2B-4A-5A is cadmium-germanium-antimony. Crystals or compounds formed from groups 1B-3A-6A and 2B-4A-5A are chalcopyrites.

It is noted that there are a number of advantages to using chalcopyrites. For instance, there is a ready availability of high purity, oriented, crack free, single chalcopyrite crystals produced for use in optical applications. These crystals are used in infrared nonlinear optical equipment to effect second harmonic generation or optical parametric oscillation. The finished materials have improved properties that should continue to improve as a result of research and development spurred by the interest of the military in using chalcopyrites in high powered lasers. Chalcopyrites have physical properties that permit their use as semiconductor radiation detectors at room temperature. As such, they operate according to the same physics as do silicon, CZT, and mercuric iodide. However, they differ from these materials in that the average atomic number is much larger than silicon, making them useful at higher energies than silicon. They can be grown in large, crack free single crystal boules (unlike CZT and mercuric iodide). They also are an improvement over mercuric iodide in that the use of mercuric iodide is limited to application in which the temperature does not exceed 80 degrees Celsius, while chalcopyrites can withstand temperatures up to several hundred degrees Celsius.

The semiconductor layer 42 may be fabricated from the afore-described material as a thin wafer. Suitable thicknesses include, e.g., from about 0.1 mm to about 20 mm, as applicable to a given material's electron/hole mobilities and resistivity. It is noted that according to embodiments the fabrication size of the detector system 40 may be smaller than other detectors typically employed in the art as embodiments can comprise a single semiconductor layer 42 and thus a single point fabrication process. Particularly suitable wafers include $^6LiInSe_2$ single crystal wafers. Accordingly, the thickness may be as thick as what the neutron detection efficiency may be for the loading of, e.g., $^6Li$. The thin wafer may also be of any suitable shape and could be cylindrical. Any suitable fabrication technique may also be employed to form the thin wafer.

As shown in FIG. 1, the semiconductor layer 42 may also include one or more transistors 44, 46, such metal oxide semiconductor (MOS) transistors, and the corresponding semiconductor transistor elements thereof can be fabricated within and/or on the semiconductor layer 42. Corresponding gates 45 and 46 are also illustrated in FIG. 1.

As further shown in FIG. 1, the detector system 40 of FIG. 1 may also include an interconnection layer 48 adjacent to the semiconductor layer 42 including interconnection elements that electrically interconnect semiconductor devices in a pattern to form a desired electronic circuit, as further described below. Interconnection elements could include insulating layers, metal layers, interconnects and so forth. The presence of a neutron cannot be detected directly by the desired electronic circuit because a neutron has no electrical charge. However, a neutron can interact with certain elements such as $^{10}B$ or $^6Li$ and create alpha particles. Thus, as shown in FIG. 1, an interaction between a neutron and the composition of the semiconductor layer 42 itself creates an alpha particle 50 and, e.g., a lithium ion in the semiconductor layer 42. Such a charged particle passing through a charge sensitive device in the detector 40, such as a biased semiconductor junction, can result in a charge in the junction due to hole-electron pair generation, which may then be detected by desired circuitry at the semiconductor junction. Examples of charge sensitive devices/elements include, e.g., P-type and N-type MOS transistors, as shown in FIG. 1, as well as other semiconductor materials. A plurality of the biased semiconductor junctions may be arranged to generate a signal or voltage charge that can be detected in a latch circuit, as further described below.

Figure 2:
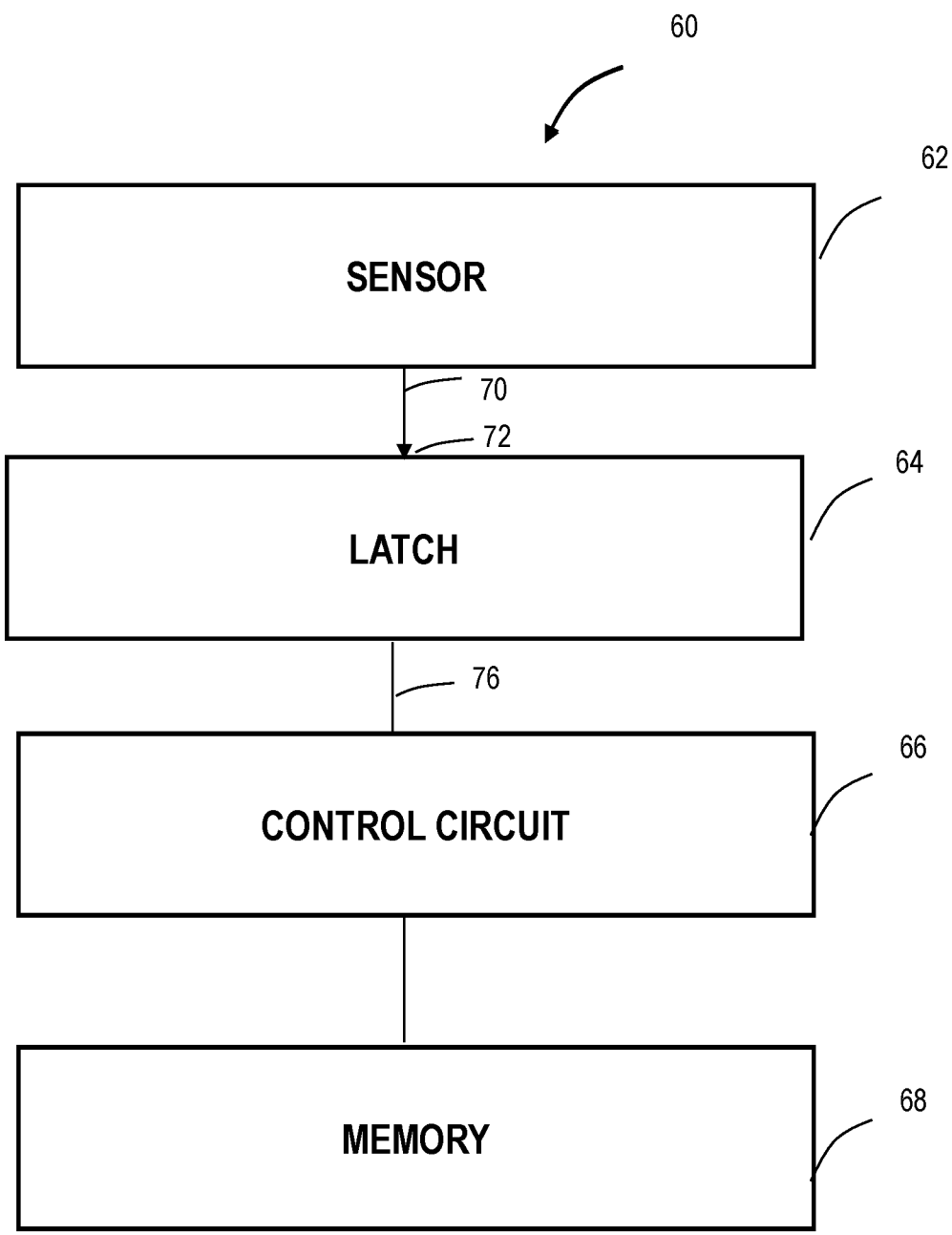
FIG. 2 is a schematic block diagram illustrating an exemplary embodiment of a neutron detection circuit of the present disclosure.

FIG. 2 is a schematic block diagram illustrating an example of a neutron detection circuit 60 of the neutron detection assembly 40, according to an embodiment. The neutron detection circuit 60 may comprise a sensor 62, latch 64, and control circuit 66 coupled to memory 68. Sensor 62 and latch 64 may be fabricated on a semiconductor die by any suitable method and form the interconnection layer 48 and active semiconductor layer 42 shown in FIG. 1. The control circuit 46 may be fabricated on the same die, or could be fabricated on a separate circuit or die. The sensor 62 may include charge collection plates connected to one or more biased semiconduction junctions which can provide a signal on output 70 indicative of a charged particle created within semiconductor layer 42. The sensor 62 may be electrically coupled to an input 72 of the latch 64. The output 70 can thus change the state of latch 64, and the resulting change in the logic state can be read by control circuit 68. Control circuit 68 can provide control signals 76 to latch 64 to control the operation thereof and allow the state of the latch 64 to be read.

The latch 64 can also include any suitable memory element. Non-limiting examples include a static random access memory (SRAM) element, dynamic random access memory (DRAM) or other types of random access memory elements, non-random access memory elements and so forth.

The neutron detection circuit 60 may include a plurality of latches 64 controlled by the control circuit 66, which is configured to read each latch 64, log the results of the read, and re-set the latch 64 to any desired pattern or frequency. For instance, the control circuit 66 may sequentially read the state of various latches 64 resulting in an upset counter for each latch state reversal, and then reset the latch. The upset counter can count the number of detected hits over a predetermined time and provide the count as an output to a device. The control circuit 66 may be implemented by any suitable means. For instance, the control circuit may be implemented in hardware and/or software, and/or at least a portion as hardware in an integrated circuit. The control circuit 66 may include a processor and a computer implemented program stored on memory 68. The computer program may include instructions which when executed by the processor, configure the processor to perform the steps of the control function described herein. The instructions may be stored in or transmitted by a computer readable data medium, which may be any suitable a non-transitory hardware medium.

Figure 3:
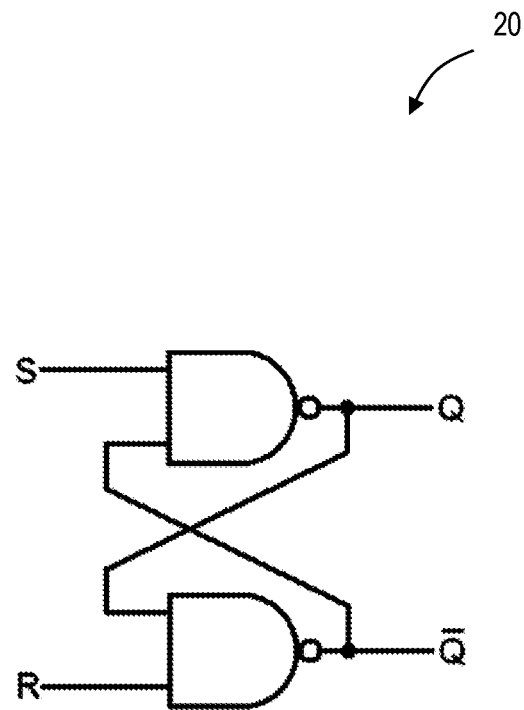
FIG. 3 is a schematic diagram illustrating an exemplary embodiment of a NAND SR latch circuit of the present disclosure.

Referring now to FIG. 3, illustrated therein is a schematic diagram of an exemplary embodiment of a NAND SR latch circuit for latch 64, according to embodiments. It is noted that, advantageously, embodiments of the invention can bypass the high voltage and readout electronics by creating a memory structure within a wide band gap material, such as a chalcopyrite material, that may be cyclically read as a direct digital output by a low power microcontroller or other controlled circuit. Sufficient voltage may be applied to the gate to charge the electrodes, where upon a neutron event, the charged particle transport occurring within the gate causes discharge of the electrodes effectively switching the logical value of the gate from a 1 to 0. In silicon memory when doped with boron, this may be referred to as the Single Event Upset (SEU) that causes memory errors in instructions intended for high altitude or space applications where rates are rather low as dopants are on the order of parts per billion (PPB). When the memory is read by the controller circuit, a summation of the 0's divided by the time since the previous read creates the "counts per seconds." Gates can be reset to a logical 1 at the directed of the controller. This may create the "Set-Reset" or SR latch as a NAND circuit.

Sequential logic circuits are bistable (two-state) devices that maintain values in either a low (logic 0) or high (logic 1) state. Latches maintain the outputs depending on the input state, where if left unchanged, the output value is latched to the input, which is set high or at 1. Set and Reset (SR) latches are able to set an output value and reset the circuit dynamically, permitting a memory until the circuit is recycled. Thus, when a value flips, the output flips as well and hold until read and reset. Functionally, the circuit may contain two NAND gates, with outputs connected to the opposing inputs that flip the value of the other. FIG. 3 illustrates a design of the individual circuit and Table 1 provides the truth table.

TABLE 1

| (NAND Logic) | | | |
|---|---|---|---|
| S (Detector Voltage) | R | Q (Count Indication) | Q-bar |
| 0 | 0 | X | X |
| 0 | 1 | 1 | 0 |
| 1 | 0 | 0 | 1 |
| 1 | 1 | Last Q | Last Q-bar |

Referring now to FIG. 3, shown therein according to embodiments, is a NAND SR latch circuit 20 where traditional voltage levels of silicon may be replaced for those needed to utilize, e.g., $LiInSe_2$ or other suitable semiconductor material employed that includes a neutron converter or absorbing material in its chemical composition, as described above. Thus, according to embodiments a semiconductor NAND based neutron detector 40 is disclosed wherein the neutron converter or absorbing material is advantageously within the semiconductor layer 42 itself. Thus, embodiments of the invention are in contrast to, e.g., the disclosure of afore-referenced U.S. Patent Application Publication No. 2013/0240744 A1, assigned on its face to Trusted Semiconductor Solutions (TSS), Inc. ("TSS Inc.") in that, e.g., the TSS Inc. disclosure employs a silicon substrate with valleys etched therein, where $^{10}B$ would be loaded underneath the silicon substrate in a separate neutron converter layer, where alphas are created from a neutron event and migrate into the silicon substrate. Thus, TSS Inc. employs separate packing or add-ons in contrast to embodiments of the invention where the neutron converter or absorbing material is within the semiconductor layer itself. Thus, compared to the TSS Inc. design, embodiments of the invention include fabrication as a single piece, where there does not need to be a neutron converter or absorber medium embedded in trenches or specific locations added to a wafer (e.g., wafer does not need an add on). It is noted that disadvantages of some prior semiconductor techniques employing loaded substrates include intricate fabricate processes, non-absorption in detection, adhesives not being transparent to alpha particles and self-absorption of alphas in neutron absorbing materials. Thus, embodiments of the invention can address the foregoing concerns.

According to embodiments, the NAND cell structure/layout may be constructed in any suitable manner and may be constructed as described in, e.g., "What is NAND Flash Memory", Toshiba, March 2003, page 3 (NAND vs. NOR-Cell Structure). The circuit may comprise a pair of gates including a gate on top and a gate on the bottom with a separation therebetween. Regarding SR (Set-Reset) latch operation and construction, such latches may be fabricated from a pair of cross-coupled NAND logical gates. Stored bit may be present on the output, Q. S and R indicate the set and reset inputs. Such a circuit can use feedback to retain and remember logical states after a change in input signals.

Additionally, a NAND flash memory is type of storage that does not require power to retain data. It may use connected floating-gate transistors with several transistors connected in a bit line. According to embodiments, a NAND flash memory may be fabricated using the afore-described chalcopyrite material. As further described below, each addressable bit may be set with 1 (high) and a single event upset (SEU) may cause a bit to change to a 0 (low). The SEUs may be counted with an arbitrary frequency and summation in counts/dwell time as a count rate.

According to embodiments, the input on a neutron detector system 40 comprising the NAND SR latch circuit 20 may be similar to a capacitor with a reverse biased diode across the terminals, wherein input voltage of the detector is S and begins in the OFF or LOW position upon startup. With the reset signal being tied to a controller's readout frequency, when the instrument first turns on, the output may be flipped upon first interrogation when the detector voltage, S, is turned to the ON or HIGH position. Upon a SEU or detection event, the level of the input can temporarily drop below a threshold as the electric field is sufficiently high to allow a localized breakdown condition following the detection event that discharges a significant portion of the charge stored, triggering the S to indicate a low condition, flipping the output of Q, which is the indication of a count. Input voltage to the detector may include an RC circuit to delay the recharge such that an event may be sufficiently propagated through the circuit, where the detector input at S will again register a high level while the output is kept until reset.

Thus, according to embodiments, the detector system includes a memory cell structure including a plurality of SR type latch/latch circuits with a controller on top and set up as logical 1 (charged capacitor) and upon a neutron event going through the semiconducting material causing a discharge, it becomes a conductor (1 changes to 0; single event upset (SEU)). According to some embodiments, it is desirable to have SEUs as high as possible. It is further noted that a memory structure is a more digital approach rather than reading the potential energy that is assumed to be lost, embodiments may resemble a Geiger counter where a count or event is not proportional to the energy of the incident particle, but rather a measure that an interaction took place in a neutron absorber material. For example, as soon as an event happens the system detects that the event has happened as long as there is enough energy to create a SEU. It may then be counted as a neutron event. Thus, in a semiconductor, according to embodiments, a capacitor may be provided with enough charge to switch from being an insulator to being a conductor, and upon conducting the charge stored therein the ground state may become 0. The cells may be set higher to logical 1 (charged state). When a gate has a SEU, it may switch from a 1 to a 0, and a microcontroller or other processor awaiting the charges can read a memory. Thus, according to embodiments, with a setting to 1, each of the memory reading steps may be employed and as soon as a 0 is detected (as opposed to a 1), the neutron count rate may be increased by 1. An example would be an embodiment with 100 memory locations, where a microcontroller initially sets all locations to a logical 1 upon startup, then the microcontroller interrogates all memory locations after 10 seconds and determines that 5 memory locations had experienced an SEU and returned a logical 0. This would result in a total count rate of 5 counts in 10 seconds, or rather 0.5 counts per second.

A particularly advantageous embodiment of the invention includes a lithium indium diselenide ($LiInSe_2$ or LISe) crystal wherein lithium may be isotopically enriched to favor presence of the thermal neutron-sensitive lithium-6 isotope. According to embodiments, a planar-geometry semiconductor detector may operate as a diode, where the signal contribution from holes may be negligible due to reabsorption and traps, where the electron transmission may be the dominant factor.

Additionally, a voltage between an anode and cathode can create an electric field within the sensor, which may act as a capacitor until a radiation event creates free ion pairs within a dielectric. At this point, the semiconductor may permit the migration of charge carriers until they are either reabsorbed or reach the electrode, which is effectively a short circuit with a built in quench. A quench is the process by which the breakdown condition ends where knock-on events triggered in the breakdown would be inhibited. In embodiments, the material also may be doped to permit rapid discharge of the electrode voltage to reach the ground state after a radiation event where material selection would be driven by design of a complex electron band structure. It is further noted that, according to embodiments, the device may be configured as, e.g., a handheld detector or stationary detector along with imaging panels. A subunit could be similar, and scaled or adapted for size, power, sensitivity and spatial resolution considerations. Reference may also be made to Section 1.3 of Introduction to SiPM, Technical Note, SensL 2011 regarding breakdown condition leading to a Single Photon Avalanche Diode (SPAD) type device.

In accordance with embodiments, detector fabrication may be similar to photolithography processes for NAND-based SRAM with some features accentuated to maximize neutron sensitivity. In further accordance with embodiments, due to the high resistivity of the material, gates may be tightly packed due to low leakage, however, a tight packing may not increase sensitivity as the size of the gates can be a tradeoff between the count rate range of the neutron detector and physical limits. For instance, regarding size of a semiconductor fabrication process and as a non-limiting example, a 14 nm process may have considerably larger gates than a 7 mm fabrication process. The optimal sensitive area and process size may be determined where a smaller process size may lessen the size of the gates, but the number of the gates may not improve counting efficiency as the inactive areas around the active volume may increase. Additionally, gates that are triggered, but not reset can contribute to instrument deadtime, similar to a Geiger-Mueller detector. Active volume within the gates can define the sensitivity, which may be maximized by minimizing the inactive volume within the detector as void spaces between gates, control logic and signal paths. With the semiconductor being fabricated with the neutron absorbing medium built in, according to embodiments, the sensitivity is expected to be significantly higher than prior techniques.

Additionally, further advantages of embodiments of the invention include that it is highly desirable and may be configured for low power neutron detection including, e.g., portable, handheld, and wearable instruments, as shown at 52 in FIG. 1, where neutron presence is suitable for detection. For instance, advantageous aspects can address the power needed for, e.g., a microcontroller to perform the counting process and the resistivity of the semiconductor to limit losses that would increase power demands on the bias supply. Furthermore, depending on the semiconductor used, the bias voltage may be considered high, but the current supply may be rather low.

Still further advantages of embodiments of the invention include an improved fabrication technique (e.g., single layer, single point fabrication) that can result in smaller fabrication sizes than typical in prior manufacturing techniques. It will be appreciated that process size may change depending on the material employed as, e.g., requirements may change depending on infrared photon creation during breakdown (e.g., afterpulsing in adjacent cell). For instance, according to non-limiting embodiments a wafer of desired chalcopyrite material (e.g., LiInSe$_2$ or LiSe$_2$) may be provided in which desired photoetching may be conducted on top thereof, and process size with imaging may be about 50 um or other suitable size. For instance, a clean etching with a methanol or other suitable solution may be performed on the top of the wafer. A mask may then be made of what the structure would look like underneath following traditional semiconductor manufacturing. Thus, a mask may be produced of what the resultant structure would look like including, e.g., where all gate locations would be and how other components would be laid out on the piece, and a mask may then be put over the structure, followed by a photoresist. Another methanol etch or other suitable etch may then be employed to clean off the material applied, e.g., for the gates. For instance, if copper or gold was employed for the top contacts, the etching process would remove the undesired material thereby leaving the desired structure (inversion of mask). The desired material can then be bonded to a printed circuit board (PCB) or other desired surface, using a direct solder joint or wire bonding, to conduct a read out of the structure. According to embodiments, the foregoing may be conducted in one step.

Other advantages of embodiments of the invention include forming NAND latch circuits with the LiSe$_2$ or other chalcopyrite or wide band gap material wafer and then reading out neutron detection events using the structure. Thus, the inventors have determined how to employ a memory circuit with specialized materials as the semiconductor to effectively detect neutrons.

Still further advantages of embodiments of the invention include a chalcopyrite semiconductor containing absorber wherein the semiconductor material is intrinsically neutron sensitive. Fabrication of such a neutron detector does not require a secondary loading process and the operating voltages may be higher, such as >50V, than silicon due to resistivity values. Moreover, according to embodiments, a wide bandgap semiconductor may be less sensitive to gamma-induced SEUs (higher gamma rejection ration (GRR) than silicon).

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, all elements, features and so forth described herein may be used in any combination, according to embodiments.

What is claimed is:

1. A wide band gap semiconductor NAND based neutron detection system comprising:
   a single, active semiconductor layer as a wafer comprising a wide gap material with a neutron absorber material comprising at least one of lithium and boron in the wide band gap material, wherein the semiconductor layer is the only layer of the semiconductor NAND based neutron detection system fabricated with any neutron absorber material and located within the composition of the semiconductor layer;
   wherein a memory structure is located within the wide band gap material and is configured to be cyclically read as a direct digital output by a controller.

2. The wide band gap semiconductor NAND based neutron detection system of claim 1, where the neutron absorber material comprises $^6$LiF and $^{10}$B.

3. The wide band gap semiconductor NAND based neutron detection system of claim 1, wherein the wide band gap material comprises a chalcopyrite compound comprising single crystals.

4. The wide band gap semiconductor NAND based neutron detection system of claim 3, comprising a latch including a NAND SR (Set-Reset) latch circuit, wherein the memory structure is located within the chalcopyrite compound.

5. The wide band gap semiconductor NAND based neutron detection system of claim 4, wherein the system is at least one of a portable instrument, a handheld instrument and a wearable instrument.

6. The wide band gap semiconductor NAND based neutron detection system of claim 1, wherein the wafer comprises a $^6$LiInSe$_2$ single crystal wafer.

7. The wide band gap semiconductor NAND based neutron detection system of claim 1, further comprising an interconnection layer adjacent to the semiconductor layer including interconnection elements.

8. A method of making a wide band gap semiconductor NAND based neutron detection system comprising:

providing a single, active semiconductor layer as a wafer comprising a wide band gap material with a neutron absorber material comprising at least one of lithium and boron in the wide band gap material, wherein the semiconductor layer is the only layer of the wide band gap semiconductor NAND based neutron detection system fabricated with any neutron absorber material and located within the composition of the semiconductor layer;

wherein a memory structure is located within the wide band gap material and is configured to be cyclically read as a direct digital output by a controller.

9. The method of claim 8, wherein the neutron absorber material comprises $^6$LiF and $^{10}$B.

10. The method of claim 8, wherein the wide band gap material comprises a chalcopyrite compound comprising single crystals.

11. The method of claim 10, wherein the wide band gap semiconductor NAND based neutron detection system comprises a latch including a NAND SR (Set-Reset) latch circuit, wherein the memory structure is located within the chalcopyrite compound.

12. The method of claim 11, wherein the wide band gap semiconductor NAND based neutron detection system is at least one of a portable instrument, a handheld instrument and a wearable instrument.

13. The method of claim 8, wherein the wafer comprises a $^6$LiInSe$_2$ single crystal wafer.

14. The method of claim 8, further comprising providing an interconnection layer adjacent to the semiconductor layer, wherein the interconnection layer includes interconnection elements.

* * * * *